(12) United States Patent
Lei et al.

(10) Patent No.: US 9,950,628 B2
(45) Date of Patent: Apr. 24, 2018

(54) POWER-MODULE ASSEMBLY WITH DUMMY MODULE

(71) Applicant: Ford Global Technologies, LLC, Dearborn, MI (US)

(72) Inventors: Guangyin Lei, Dearborn Heights, MI (US); Michael W. Degner, Novi, MI (US); Edward Chan-Jiun Jih, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 24 days.

(21) Appl. No.: 15/065,330

(22) Filed: Mar. 9, 2016

(65) Prior Publication Data
US 2017/0259672 A1  Sep. 14, 2017

(51) Int. Cl.
| | |
|---|---|
| *G06F 1/16* | (2006.01) |
| *H05K 5/00* | (2006.01) |
| *H05K 7/00* | (2006.01) |
| *B60L 11/02* | (2006.01) |
| *B60L 11/18* | (2006.01) |
| *H02M 7/00* | (2006.01) |
| *H02M 7/44* | (2006.01) |
| *H05K 7/20* | (2006.01) |

(52) U.S. Cl.
CPC ........... *B60L 11/02* (2013.01); *B60L 11/1816* (2013.01); *H02M 7/003* (2013.01); *H02M 7/44* (2013.01); *H05K 7/20927* (2013.01)

(58) Field of Classification Search
CPC .... H05K 7/20927; H02M 7/003; H02M 7/44; B60L 11/02; B60L 11/1816

USPC .................. 361/689, 698; 257/675, 686, 714
See application file for complete search history.

(56) References Cited

U.S. PATENT DOCUMENTS

| | | | |
|---|---|---|---|
| 3,648,113 A * | 3/1972 | Rathjen | H05K 7/20563 174/15.1 |
| 4,186,422 A * | 1/1980 | Laermer | H05K 1/0272 361/689 |
| 5,125,451 A | 6/1992 | Matthews | |
| 5,170,319 A | 12/1992 | Chao-Fan Chu et al. | |
| 6,329,089 B1 | 12/2001 | Roberts et al. | |
| 7,200,007 B2 * | 4/2007 | Yasui | H02M 7/003 165/80.4 |
| 7,835,151 B2 * | 11/2010 | Olesen | H01L 23/473 165/121 |
| 8,418,751 B2 | 4/2013 | Bezama et al. | |
| 8,537,551 B2 | 9/2013 | Ide et al. | |
| 8,895,173 B2 | 11/2014 | Gandhi et al. | |
| 8,971,041 B2 | 3/2015 | Sharaf et al. | |
| 2003/0132040 A1 | 7/2003 | Radosevich et al. | |
| 2005/0030717 A1 | 2/2005 | Inagaki et al. | |
| 2005/0259402 A1 * | 11/2005 | Yasui | H02M 7/003 361/716 |
| 2008/0251909 A1 | 10/2008 | Tokuyama et al. | |

(Continued)

*Primary Examiner* — Anthony Haughton
(74) *Attorney, Agent, or Firm* — David B. Kelley; Brooks Kushman P.C.

(57) ABSTRACT

A power-electronics system includes a plurality of power modules each having a power stage and defining a side pocket. The power stages are stacked in an array such that the side pockets are interleaved with the power stages. A dummy module defines a first coolant pocket and is disposed within the array such that the first coolant pocket cooperates with one of the side pockets to define a coolant chamber.

20 Claims, 15 Drawing Sheets

(56) References Cited

U.S. PATENT DOCUMENTS

| | | |
|---|---|---|
| 2009/0146293 A1 | 6/2009 | Olesen |
| 2011/0316143 A1 | 12/2011 | Noritake et al. |
| 2011/0318884 A1 | 12/2011 | Noritake et al. |
| 2012/0001341 A1 | 1/2012 | Ide et al. |
| 2013/0003301 A1 | 1/2013 | Miyamoto et al. |
| 2013/0335920 A1 | 12/2013 | Murata |
| 2014/0198453 A1 | 7/2014 | Zhang et al. |
| 2014/0340845 A1* | 11/2014 | Straznicky ............... H05K 7/20 361/689 |
| 2015/0348669 A1 | 12/2015 | Joshi et al. |
| 2017/0040241 A1 | 2/2017 | Yoshida |
| 2017/0259691 A1 | 9/2017 | Lei et al. |
| 2017/0265337 A1 | 9/2017 | Lei et al. |

* cited by examiner

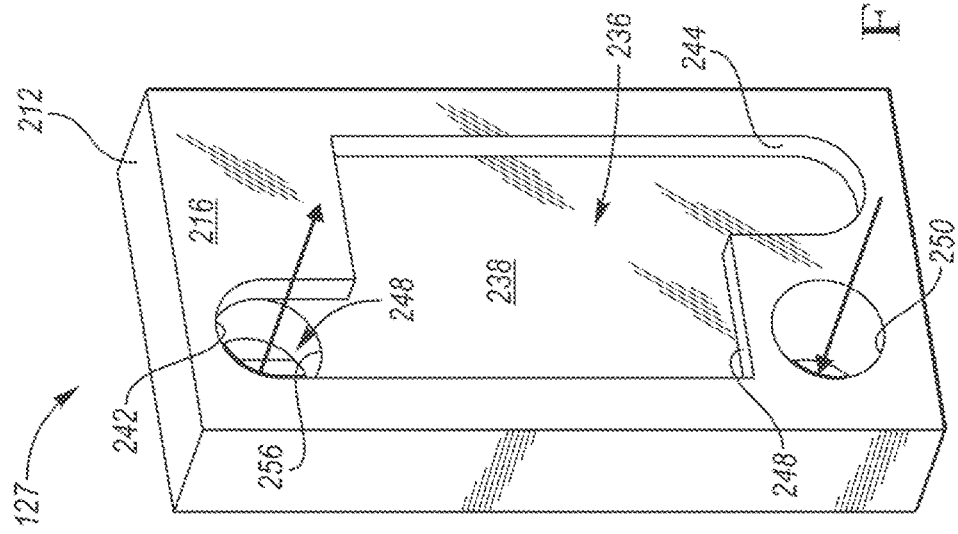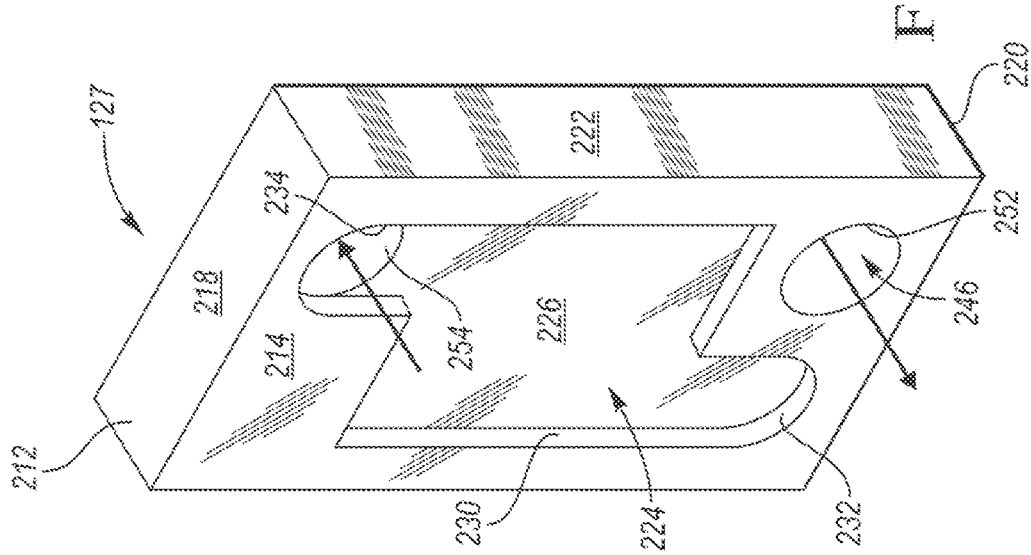

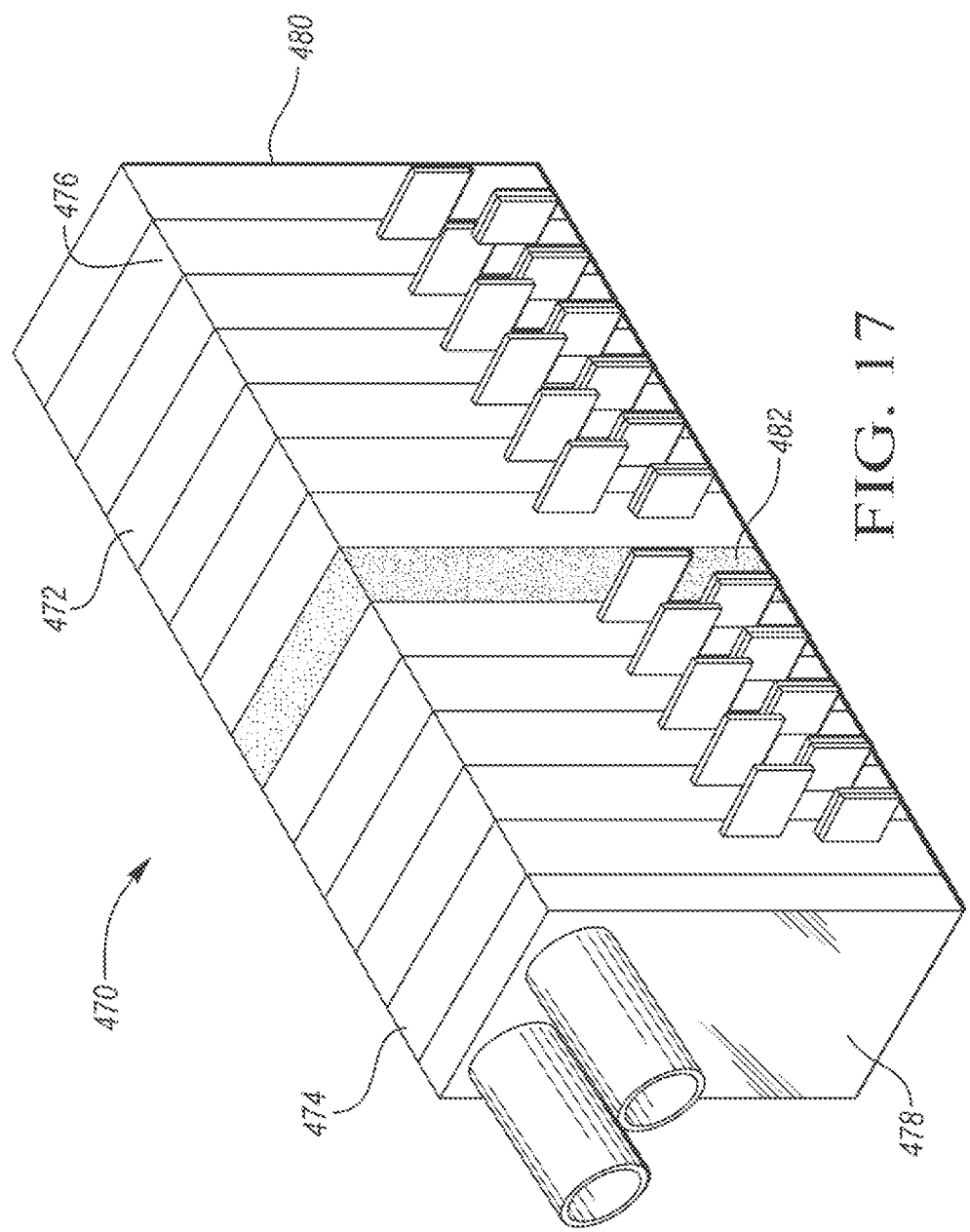

POWER-MODULE ASSEMBLY WITH DUMMY MODULE

TECHNICAL FIELD

The present disclosure relates to power-module assemblies for an electric drivetrain of an automobile.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert direct current coming from the battery into alternating current compatible with the electric machines. The power inverter may also act as a rectifier to convert alternating current from the electric machines to direct current compatible with the battery.

SUMMARY

According to one embodiment, a power-electronics system includes a plurality of power modules each having a power stage and defining a side pocket. The power stages are stacked in an array such that the side pockets are interleaved with the power stages. A dummy module defines a first coolant pocket and is disposed within the array such that the first coolant pocket cooperates with one of the side pockets to define a coolant chamber.

According to another embodiment, a power inverter includes a plurality of power modules each having a power stage and a major side defining a coolant pocket adjacent to the power stage. The power modules are stacked in an array such that the pockets are interleaved with the power stages. A dummy module is disposed within the array between adjacent power modules to divide the array into first and second portions.

According to yet another embodiment, a power-module assembly for a power-electronics system includes a plurality of same power modules each including a power stage and major sides each defining a pocket adjacent to the power stage. The power modules are stacked in an array such that pockets adjacent to each other form coolant chambers interleaved with the modules. A dummy module has a same footprint as the power modules and is disposed within the array between two adjacent power modules to divide the array into first and second portions. The array is configured such that coolant flows through the coolant chambers of the first portion in a first direction and coolant flows through the coolant chambers of the second portion in a second direction.

BRIEF DESCRIPTION OF THE DRAWINGS

FIG. 8A is a front perspective view of a dummy module for the power-module assembly of FIG. 4.
FIG. 8B is a back perspective view of the dummy module of FIG. 8A.
FIG. 17 is a perspective view of a power-module assembly according to yet another embodiment.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
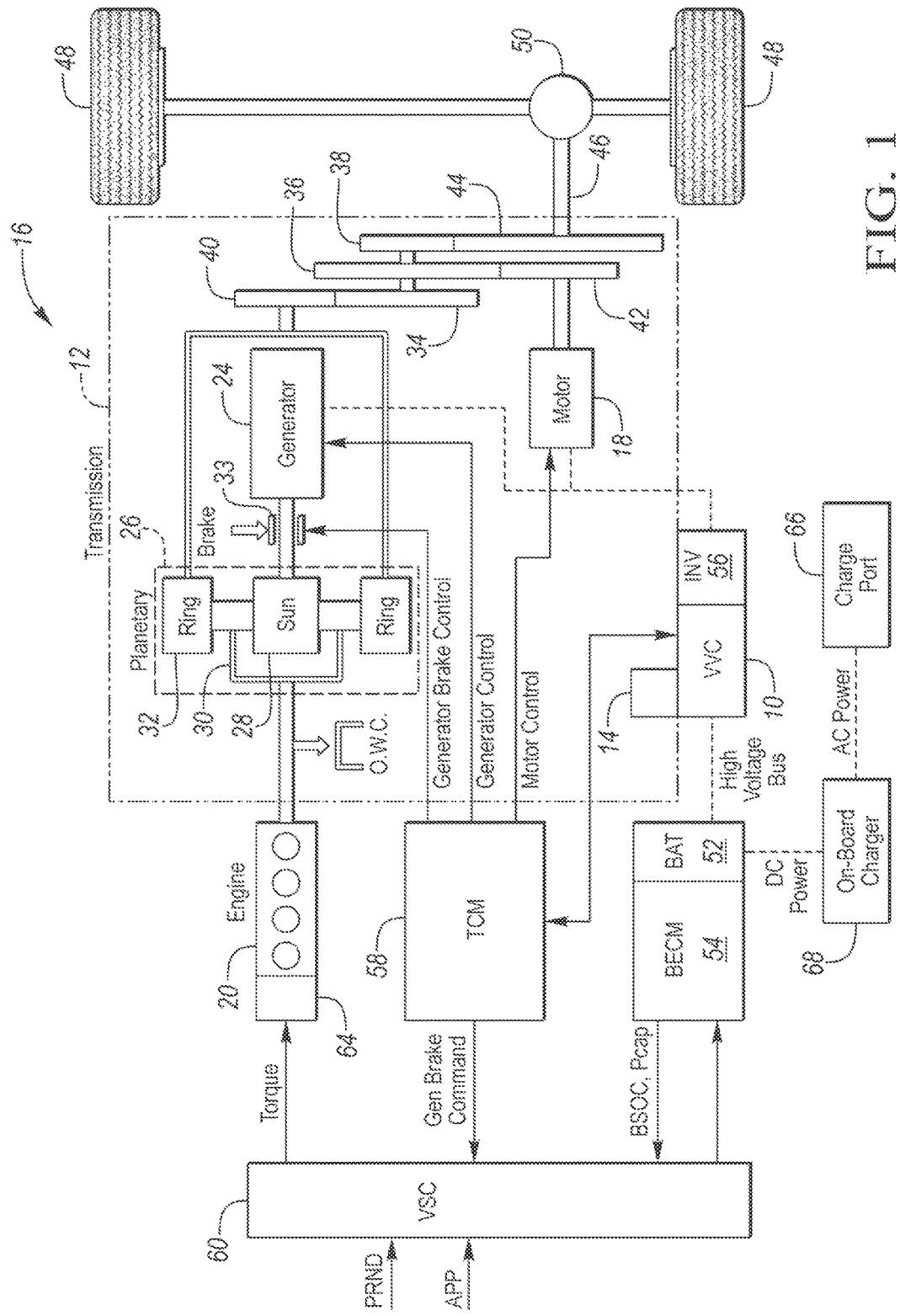
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
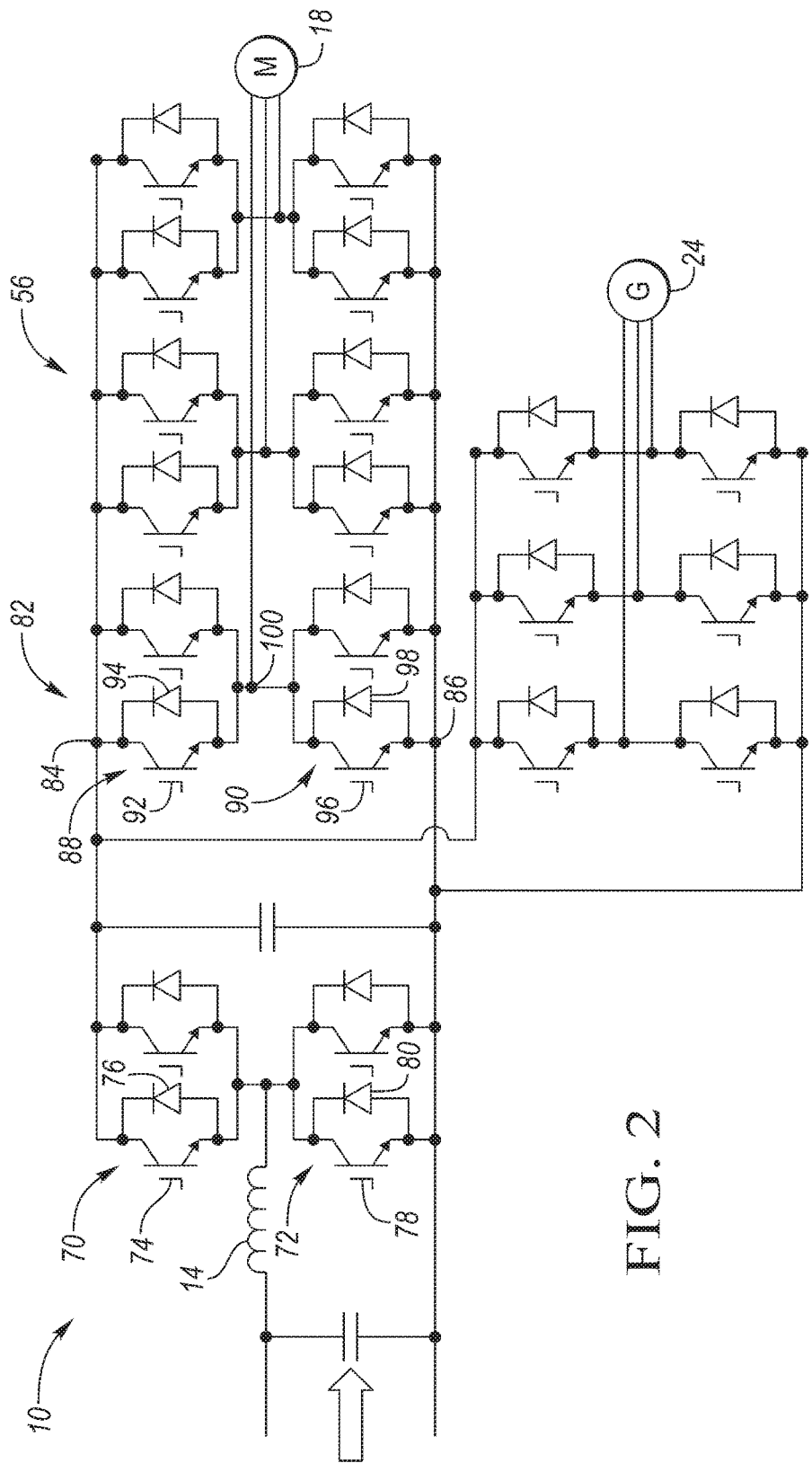
FIG. 2 is a schematic diagram of a variable voltage converter and a power inverter.

Referring to FIG. 2, an electrical schematic of the VVC 10 and the inverter 56 is shown. The VVC 10 may include a one or more power stages having a transistor-based switching arrangement, such as a half bridge. Each power stage includes a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The inverter 56 may include a plurality of power stages having a transistor-based switching arrangement, such as a half-bridge that are stacked in an assembly. Each of the half bridges may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in parallel to a first diode 94. The second switching unit 90 may include a second transistor 96 connected in parallel to a second diode 98. The first and second transistors 88, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24.

In the illustrated embodiment, the VVC 10 includes two power stages and the inverter includes 9 power stages (three for the generator 24 and six for the motor 18). In other embodiments, the VVC 10 includes one power stage and the inverter includes six power stages (three for the generator 24 and three for the motor 18). The VVC power stages and the inverter power stages may be identical components and generally referred to as power stages 82. Both the VVC power stages and the inverter power stages may be arranged in a common stack.

Figure 3:
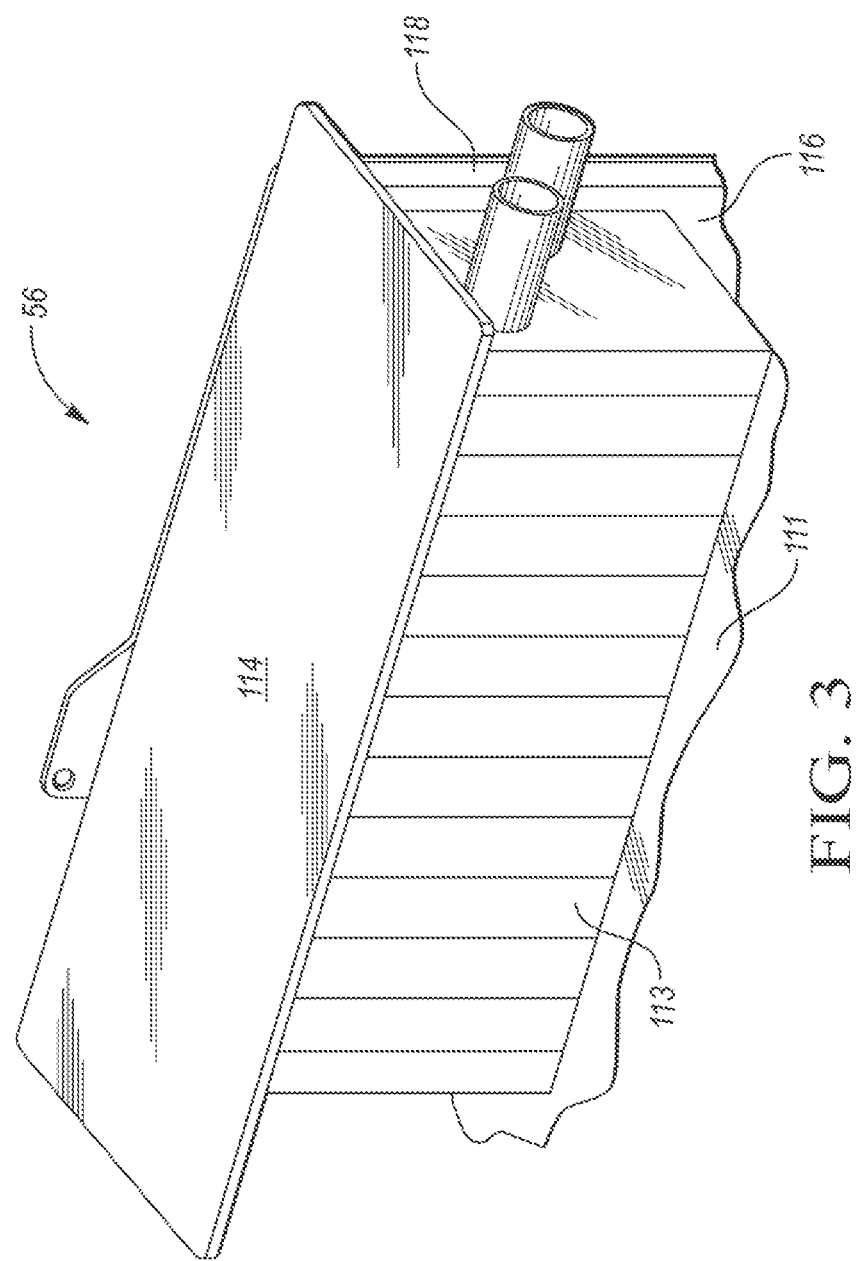
FIG. 3 is a perspective view of a power inverter.

Referring to FIG. 3, the vehicle power inverter 56 may be mounted on a vehicle component 111, such as a body structure, frame member, or powertrain component. The power inverter 56 may include a power-module assembly 113 that is electrically connected with a gate drive board 114, a capacitor bank 116, and a control board 118. The power-module assembly 113 may include a plurality of power modules stacked in an array and each having one or more half bridges packaged in a power stage.

Figure 4:
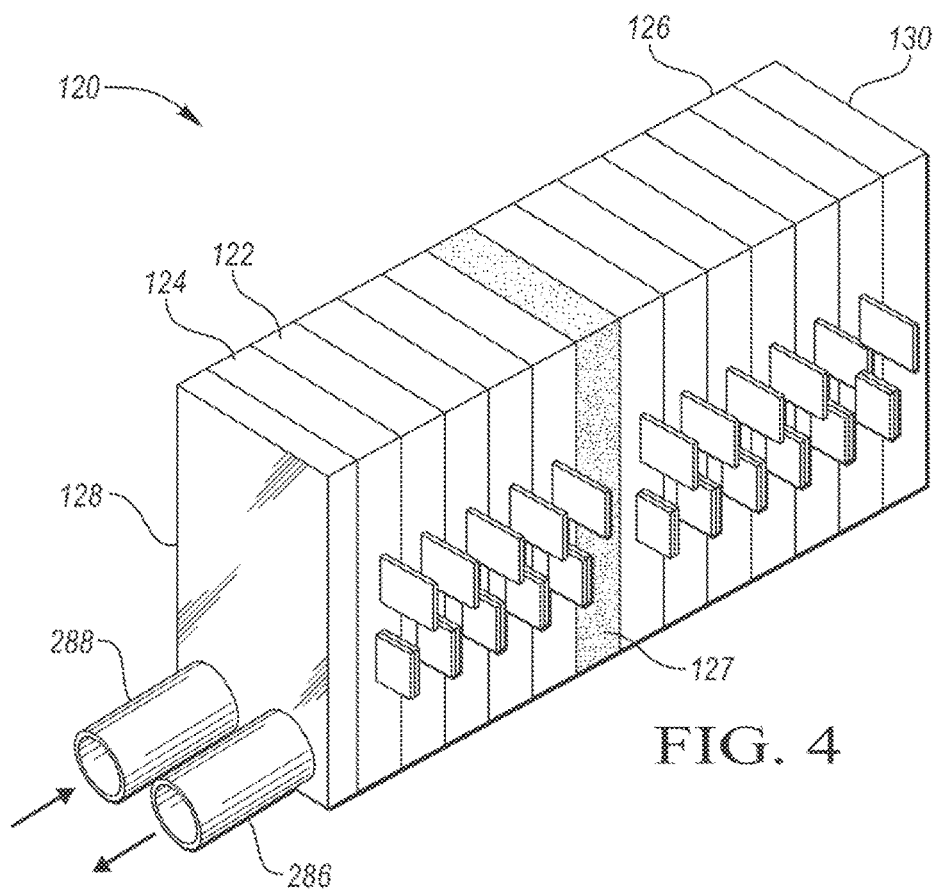
FIG. 4 is a perspective view of a power-module assembly for a power inverter.

FIGS. 4 to 22 and the related discussion describe example power-module assemblies and their individual components. Referring to FIG. 4, an example power-module assembly 120 includes a plurality of power modules 122 arranged in a stack. The power-module assembly 120 includes a first power module 124 defining one end of the stack and a last power module 126 defining the other end of the stack. A first endplate 128 is disposed against the first module 124, and a second endplate 130 is disposed against the last module 126. The endplates cooperate to sandwich the stack and may provide compression to help hold the stack together. A dummy module 127 is disposed within the stack between two adjacent power modules and divides that stack into first and second portions. The dummy module has a same footprint as the power modules to fit cohesively in the stack. Unlike the power modules, which have semiconductor devices, the dummy module does not have any electrical components. The purpose of the dummy module 127 is to reroute the coolant flowing within the power-module assembly 120. The dummy module 127 includes pockets, channels, ports, and bores configured to convey and reroute the coolant as desired. (This will be explained in detail below.) Inclusion of the dummy module 127 allows the first and second portions of the stack to flow differently. The dummy module 127 may be disposed approximately at the midpoint of the stack. In the illustrated embodiment, the power-module assembly 120 includes eleven power modules, thus the dummy module is slightly off-center with the first portion including six power modules and the second portion including five power modules.

The power-module assembly 120 may be secured together by adhesive, bracketry, or fasteners extending through the assembly. The power modules 122 may all be a same power module, or the power-modules assembly 120 may include two or more sets of power modules that are at least slightly different. In example power-module assembly 120, all of the power modules 122 are the same.

Figure 5:
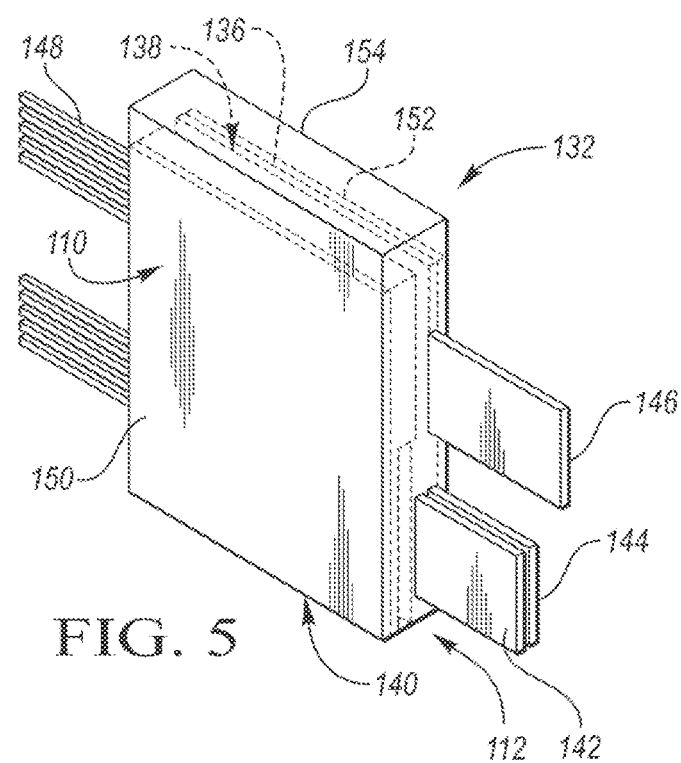
FIG. 5 is a perspective view of a power stage.

Referring to FIG. 5, each of the power modules 122 includes a power stage 132 that contains the semiconductor devices. Each of the power stages 132 may include opposing major sides 110, opposing minor sides 112, a top 138, and a bottom 140. The power stage 132 also includes a positive DC power terminal 142, a negative DC power terminal 144, an AC power terminal 146, and signal pins 148 that are electrically connected with the semiconductor devices of the power stage 132. The location of the terminals and signal pins may vary by embodiment and are not limited to the configuration shown. For example, the signal pins 148 may be on the left minor side 112 and the terminals 142, 144, and 146 may be on the right minor side 112. A first plate 150 defines the outer surface of one of the major sides 110 and a second plate 136 defines the other of the major sides 110 of the power stage 132. The plates 150, 152 may be metallic, plastic, composite, or a combination thereof. The semiconductor devices of the power stage 132 may be filled with an epoxy 154 or other filler to electrically isolate the semiconductor devices from the plates and other components.

Referring to FIGS. 6A-6C and 7, each of the power modules 122 may include a body 156 having a front 158, a back 160, a right side 162, a left side 164, a top 166, and a bottom 168 that are interconnected along edges. The front 158 and the back 160 may be referred to as major sides as they have a larger surface area than the other sides of the body. The other sides of the body may be referred to as the minor sides. The power stage 132 is at least partially disposed within the body. The body may be a polymer or an epoxy that encapsulates the power stage 132. Portions of the power stage 132 may be exposed through one or more sides of the body 156. For example, the terminals and the signal pins may extend through the left and right sides 162, 164, and the major sides 110 may be exposed through the front 158 and/or the back 160.

Depending upon the embodiment, the power-module assembly may be configured to have series cooling, parallel cooling, or a combination of both (known herein as parallel-series cooling or series-parallel cooling depending upon the design). A parallel-series circuit is a fluid circuit that includes two or more parallel circuits that are interconnected in series.

Parallel cooling and series cooling have advantages and drawbacks as compared to each other. Parallel is may be preferable when overall pressure drop is a concern. Paralleling the cooling channels results in lower pressure drop. In addition, by carefully design the cooling path, it is possible for all the cooling channels to pass the same amount of coolant at the same time. This allows more uniform cooling of each semiconductor. The drawback of parallel cooling is the relatively low flow rate in each cooling channel. On the other hand, series cooling has a uniform flow rate through all of the cooling channels. But, series cooling circuits typically have a higher overall pressure drop, which is a limiting factor for some systems. The mixed parallel-series cooling strategy takes the advantage of both parallel and series cooling and diminishes the drawbacks. The coolant flow rate in each channel is higher than that of a parallel cooling design and the overall pressure drop is lower than that of a series cooling design.

Figure 6A:
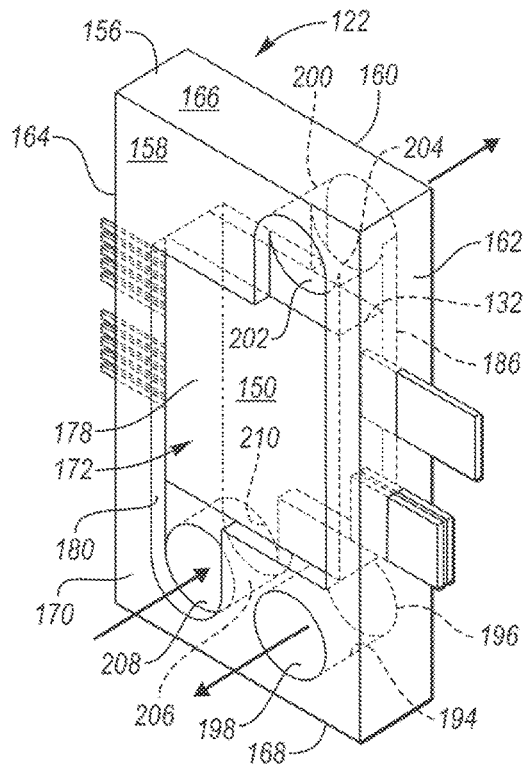
FIG. 6A is a perspective view of a power module according to one embodiment.
Figure 7:
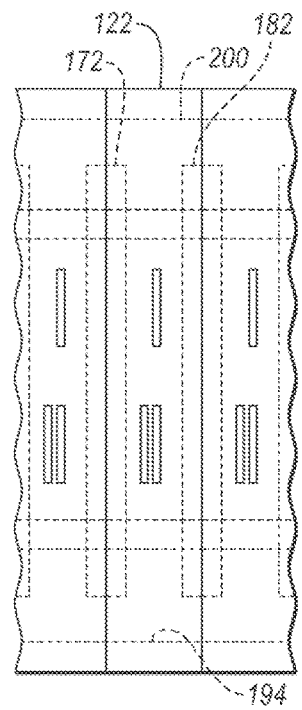
FIG. 7 is a side view of a portion of the power-module assembly of FIG. 4.
Figure 6B:
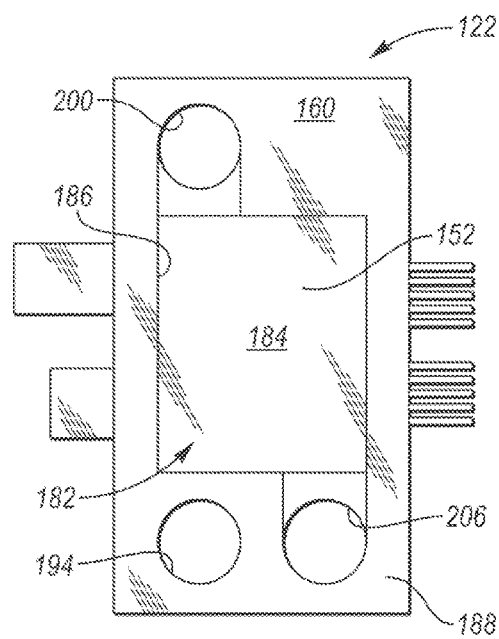
FIG. 6B is a back view of the power module of FIG. 6A.
Figure 6C:
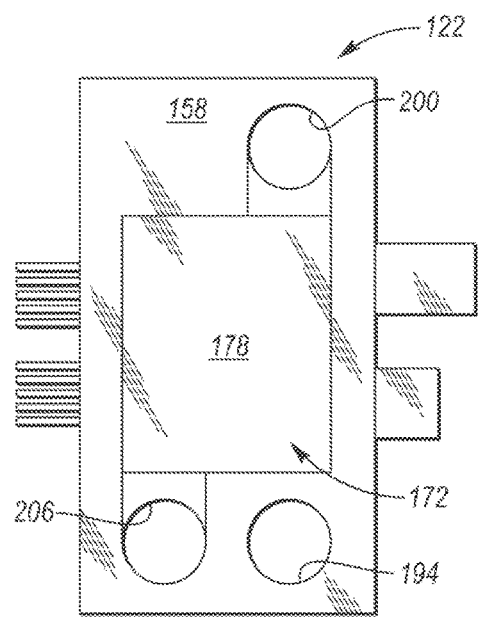
FIG. 6C is a front view of the power module of FIG. 6A.

The power module 122 illustrated in FIGS. 6A-6C is designed for a parallel-series cooling circuit that includes first and second parallel circuits connected in series. In the illustrated example, the power modules 122 are all the same (i.e., designed to be identical). Each power module 122 may define a front coolant pocket 172 defined by the front 158. The coolant pocket 172 includes a floor 178 and a sidewall 180 extending between the outer surface 170 of the front 158 and the floor 178. The power stage 132 may be arranged in the body 156 such that a portion of the floor 178 is formed by the first plate 150. This allows the coolant to be circulated directly across the first plate 150 to increase cooling efficiency by removing thermal resistance between the coolant and the power stage 132.

Each power module 122 may also define a back coolant pocket 182 defined by the back 160. The coolant pocket 182 includes a floor 184 and a sidewall 186 extending between the outer surface 188 of the back 160 and the floor 184. The power stage 132 may be arranged in the body 156 such that a portion of the floor 184 is formed by the second plate 152. This allows the coolant to be circulated directly across the second plate 152 to increase cooling efficiency by removing thermal resistance between the coolant and the power stage 132.

Each of the modules 122 defines a plurality of passageways generally extending through a thickness of the body. (Note: thickness refers to the distance between the front 158 and the back 160. The floors are considered to be part of the front or back even though it is recessed inwardly from the outer most surface of the front or back.) For example, the module 122 may include a first passageway 194 that extends through the body 156 at the lower right corner. The first passageway 194 includes an entrance port 196 defined by the outer surface 188 of the back 160, and an exit port 198 defined by the outer surface 170 of the front 158. A second passageway 200 extends through the body 156 at an upper right corner. The second passageway 200 includes an entrance port 202 defined by the floor 178 of the front side 158, and an exit port 204 defined by the floor 184 of the backside 160. A third passageway 206 extends through the body 156 at the lower left corner and includes an entrance port 208 defined by the floor 178, and an exit port 210 defined by the floor 184. The second passageway 200 and the third passageway 206 directly connect the front pocket 172 and the back pocket 182 in fluid communication to allow coolant to pass between the opposing pockets of the module 122. The first passageway 194 is not in direct fluid communication with either of the pockets as the first passageway 194 does not connect with either pocket.

Referring to FIGS. 8A and 8B, the dummy module 127 includes a body 212 having a front 214, a back 216, a top 218, a bottom 220, and sidewalls 222 that are interconnected along edges. The front 214 defines a coolant pocket 224 having a floor 226 recessed inwardly from an outer surface of the front, and sidewalls 230 extending between the floor 226 and the outer surface. The front pocket 224 includes a first end 232 and a second end 234. During operation, coolant flows from the first end 232 towards the second end 234 in a generally upward direction. Used herein, the term "generally flows" describes the overall flow direction of the coolant as a opposed to an instantons flow direction of individual molecules of the liquid. For example, the coolant flow across the front 214 is generally upward despite the fact the some coolant molecules may flow to the left, to the right, or on a diagonal during their journey from the first end 232 to the second end 234.

The back 216 also defines a coolant pocket 236 having a floor 238 recessed inwardly from an outer surface of the back 216, and sidewalls 240 extending between the floor 238 and the outer surface. The back pocket 236 includes a first end 242 and a second end 244. During operation, coolant flows from the first end 242 towards the second end 244 in a generally downward direction.

The dummy module 127 defines one or more passageways extending through a thickness of the module. For example, the dummy module 127 may include a first passageway 246 that extends through the body 212 near the lower right corner and outside the perimeter of front and back coolant pockets. The first passageway 246 includes an entrance port 250 defined by an outer surface of the back 216, and an exit port 252 defined by an outer surface of the front 214. A second passageway 248 extends through the body 212 near an upper right corner of the module. The second passageway 248 is disposed within a perimeter of the pockets and includes entrance port 254 defined by the floor 226 of the front pocket, and an exit port 256 defined by the floor 238 of the back pocket. The second passageway 248 connects the front pocket 224 and the back pocket 236 in fluid communication allowing coolant to flow from the front pocket 224 to the back pocket 236.

Figure 9:
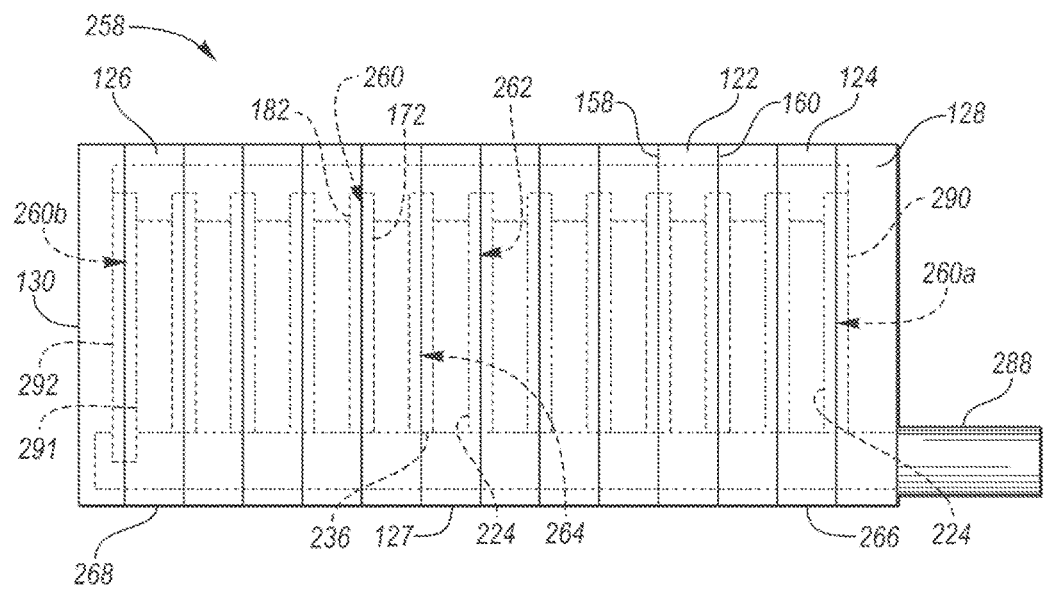
FIG. 9 is a side view of the power-module assembly of FIG. 4.

Referring to FIG. 9, the power modules 122 may be stacked in an array 258 with the front 158 of one modules 122 disposed against the back 160 of an adjacent module, and with the back 160 disposed against the front 158 of another adjacent module. A gasket or other sealing means may be disposed between abutting modules to seal the array 258. Adjacent front and back pockets 172, 182 cooperate to define a first set of coolant chambers 260 that are interleaved with the modules 122. The front pocket 236 of the dummy module 127 cooperates with a corresponding back pocket 182 to define another coolant chamber 264, and the back pocket 224 cooperates with a corresponding front pocket 172 to define yet another coolant chamber 262.

Figure 10:
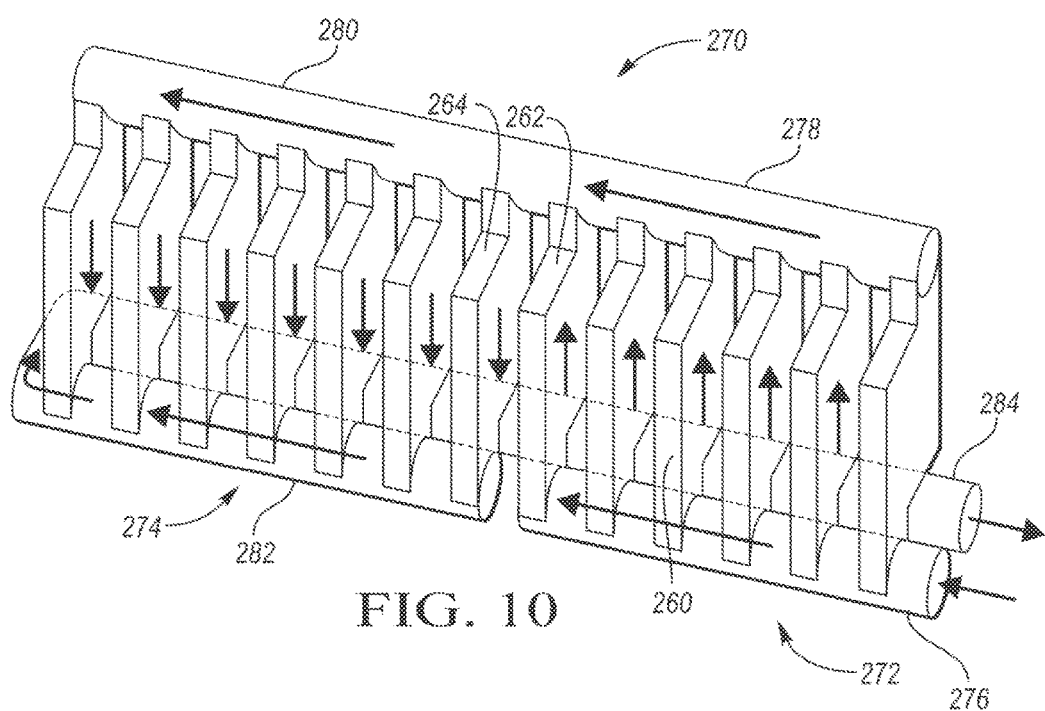
FIG. 10 is a schematic representation of an example coolant circuit of the power-module assembly of FIG. 4.

The dummy module 127 splits the array into a front portion 266 that includes the first five power modules and a rear portion 268 that includes the last six modules. Of course, the number of modules in the portions may vary by embodiment. The pockets and passageways of the dummy module 127 are arranged to change the coolant flow through the array 258 such that the coolant circuit within the front portion 266 is different than the coolant circuit within the second portion. FIG. 10 illustrates one example of how the dummy module creates different coolant circuits within the front and back portions of the array.

The front endplate 128 may define a pocket 290 that cooperates with the front pocket 224 of the first module 124 to define a coolant chamber 260a. One end of the pocket 290 may define an opening of a passageway that connects with the inlet port 288 and the other end of the pocket 290 is aligned with passageway 200 of the first module 124. The rear endplate 130 also defines a pocket 292 that cooperates with the back pocket 291 of the last module 126 to form another of the coolant chambers 260b.

FIG. 10 shows an example parallel-series circuit 270. FIG. 10 is a schematic representation of the coolant flow through the assembly 120. The conduits and chambers shown in FIG. 10 are not actual structural components disposed within the assembly 120. Rather, the power modules and the dummy module of the assembly 120 include passageways and pockets that cooperate to define the boundaries of the conduits and the chambers shown in FIG. 10.

The parallel-series coolant circuit 270 includes a first circuit 272 disposed within the front portion 266, and a second circuit 274 disposed within the rear portion 268. The first circuit 272 is a parallel circuit that cools the modules within the front portion. The first circuit includes a supply conduit 276 extending along a bottom of the front portion, and a return conduit 278 extending along a top of the front portion. The supply conduit 276 and the return conduit 278 are in fluid communication with each of the coolant chambers 260 of the front portion 266 and coolant chamber 262, which is the last coolant chamber of the first circuit 272. During operation, coolant circulates from the supply conduit 276, through the coolant chambers in a generally upward direction, and into the return conduit 278. The supply conduit 276 is not a tube or pipe, but rather, is formed by the cooperation of the passages 206, which are aligned to define the supply conduit 276. Similarly, the return conduit 278 is formed by the cooperation of passages 200, which are aligned to define the return conduit.

The second circuit 274 is a parallel circuit that cools the modules within the rear portion 268. The second circuit 274 includes a supply conduit 280 extending along a top of the rear portion, and a return conduit 282 extending along a bottom of the rear portion. The supply conduit 280 and the return conduit 282 are in fluid communication with each of the coolant chambers 260 of the rear portion 268 and coolant chamber 264, which is the first coolant chamber of the second circuit 274. The supply conduit 280 is formed by the cooperation of the passages 200, and the return conduit 282 is formed by the cooperation of the passages 206. During operation, coolant circulates from the supply conduit 280, through the coolant chambers in a generally downward direction, and into the return conduit 282. In this embodiment, coolant flows through the chambers in the front portion 266 in a first direction (e.g., upwardly), and coolant flows through the chambers in the rear portion 268 in a second direction (e.g., downwardly) that is substantially opposite to the first direction. In other embodiments, coolant in the front and rear portions may flow through the chambers in the same direction.

The supply conduit 280 and the return conduit 278 are axially aligned and are interconnected. While the supply conduit 276 and the return conduit 280 are called out by different names based on their function, structurally, they are a single conduit that extends through the entire array. The supply conduit 276 and the return conduit 282 are also axially aligned, but are not interconnected because the dummy module 127 does not include a passageway that aligns with passageways 206 of the power modules 122. This break, which is caused by the dummy module, causes conduit 280 to become the supply conduit for the second circuit 274 and causes conduit 282 to be a return conduit. On the top side, the dummy module 127 does include a passageway 248 to allow coolant within the return conduit 278 to flow into the supply conduit 280 to provide coolant to the second circuit 274. The passageway 248 interconnects the two parallel circuits.

The coolant circuit 270 may also include a return mainline 284 that is in fluid communication with the return conduit 282. The return mainline 284 conveys coolant from the rear end plate 130 to the front end plate 128 where the outlet port 286 is located. The supply conduit 276 is connected with the inlet port 288. The inlet and outlet ports 288, 286 are connected with lines of the thermal-management system. In some embodiments, the return mainline 284 may be omitted if the inlet and outlet ports are on opposite plates.

Figure 11:
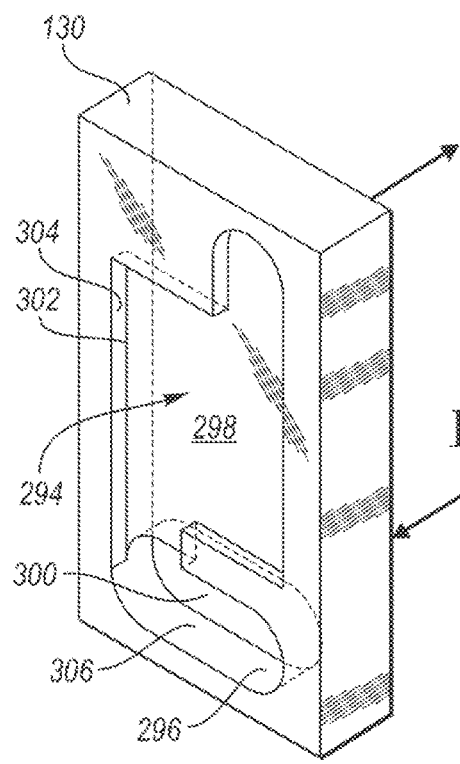
FIG. 11 is a perspective view of an end plate of the power-module assembly of FIG. 4.

Referring to FIG. 11, the rear endplate 130 includes a pocket 292 that cooperates with the pocket of the last module 126 to define a coolant chamber 260b for circulating coolant across the power stage of the last module. The pocket 292 includes a floor 298 recessed inwardly from the outer surface of the endplate 130. The rear endplate 130 also includes a channel 296 that connects the return conduit 282 and the return mainline 284 in fluid communication. The pocket 292 includes a floor 300 which is recessed into the endplate even farther than floor 298. The pocket 292 also includes a sidewall 302 that includes a first portion 304 that extends between the outer surface and the floor 300, and a second portion 306 that extends between the floor 298 and the floor 300.

Figure 12:
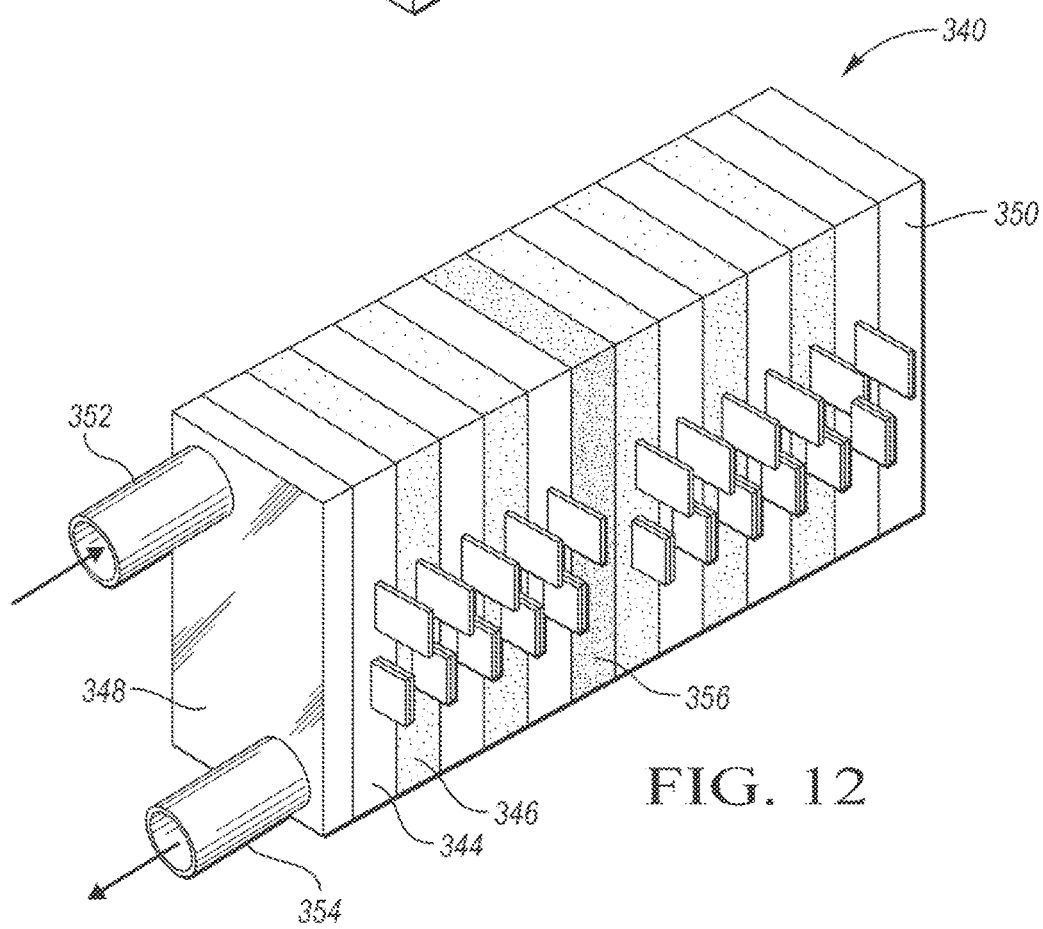
FIG. 12 is a perspective view of a power-module assembly according to another embodiment.

FIG. 12 illustrates another power-module assembly 340 that includes a first set of modules (A-module) 344 and a second set of power modules (B-modules) 346 that are alternatingly arranged along the length of the stack. A first endplate 348 and a second endplate 350 sandwich the stack of modules. One or more of the endplates may include an inlet port 352 and/or an outlet port 354 that connects with the thermal-management system. Each of the modules includes features that cooperate to define a coolant circuit extending through the power-module assembly 340 in order to cool the power stages. The assembly 340 also includes a dummy module 356 disposed near the middle of the stack.

Figure 13:
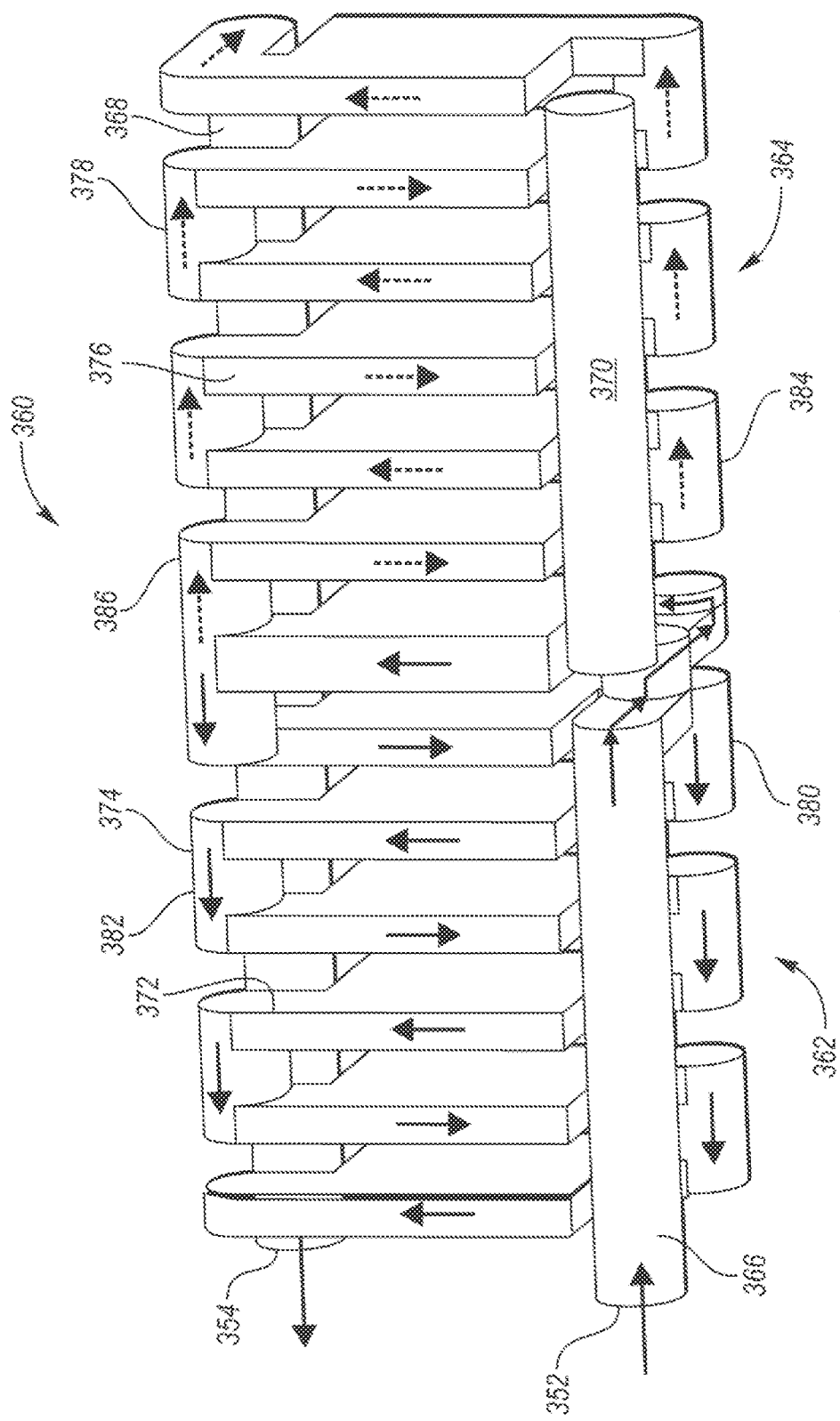
FIG. 13 is a schematic representation of an example coolant circuit of the power-module assembly of FIG. 12.

The coolant circuit may be arranged in a series-parallel circuit. FIG. 13 shows an example series-parallel circuit 360. A series-parallel circuit is two or more series circuits connected in parallel. FIG. 13 is a schematic representation of the coolant flow through the assembly 340. The conduits and chambers shown in FIG. 13 are not actual components disposed within the assembly 340. Rather, the modules of the assembly 340 include bores, channels, and pockets that cooperate to define the boundaries of the conduits, passageways, and chambers of the coolant circuit 360 shown in FIG. 13.

Cooling circuit 360 includes a first series circuit 362 disposed on one side of the dummy module 356, and a second series circuit 364 disposed on the other side of the dummy module. The first and second series circuits 362, 364 share a common supply conduit 366 that extends about halfway through the power-module assembly 340; starting at the inlet port 352 and stopping at the dummy module 356. The first series circuit 362 starts at the dummy module 356 and extends towards the first endplate 348. The second series circuit 364 starts at the dummy module 356 and extends towards the second endplate 350. The first and second series circuits share a return conduit 368. The return conduit 368 extends completely through the assembly 340 and starts at the second endplate 350 and extends to the outlet port 354. The coolant circuit 360 may also include a dead conduit 370 that performs no function. The dead conduit 370 does not receive coolant because the dummy module 356 prevents coolant from flowing from the supply conduit 366 and into the dead conduit 370.

The first series circuit 362 includes a plurality of coolant chambers 372 that are interleaved with the modules on the first half of the assembly 340. The coolant chambers 372 are defined by pockets recessed into the modules as will be described below in more detail. Each of the cooling chambers 372 is connected in fluid communication by passageways 374 that extend through the one of the modules. Some of the passageways 374, called A-passageways 380, are defined by the A-modules 344 and others of the passageways 374, called B-passageways 382, are defined by the B-modules 346. In the illustrated embodiment, the A-passageways 380 are located on the bottom of the assembly 340, and the B-passageways 382 are located on the top of the assembly 340. The first series circuit 362 may be arranged such that adjacent cooling chambers 372 flow in substantially opposite directions. For example, the coolant flows generally upward through some chambers, and generally downward through other chambers when the assembly 340 is oriented as shown in FIG. 12.

The second series circuit 364 includes a plurality of coolant chambers 376 that are interleaved with the modules on the second half of the assembly 340. Each of the cooling chambers 376 are connected in fluid communication by passageways 378 that each extend through the modules. Some of the passageways 378, called A-passageways 384, are defined by the A-modules 344 and other passageways 374, called B-passageways 386, are defined by the B-modules 346. In the illustrated embodiment, the A-passageways 384 are located on the top of the assembly 340, and the B-passageways 386 are located on the bottom of the assembly 340. The second series circuit 364 may be arranged such that adjacent cooling chambers 376 flow in substantially opposite directions.

Figures 14A, 14B:
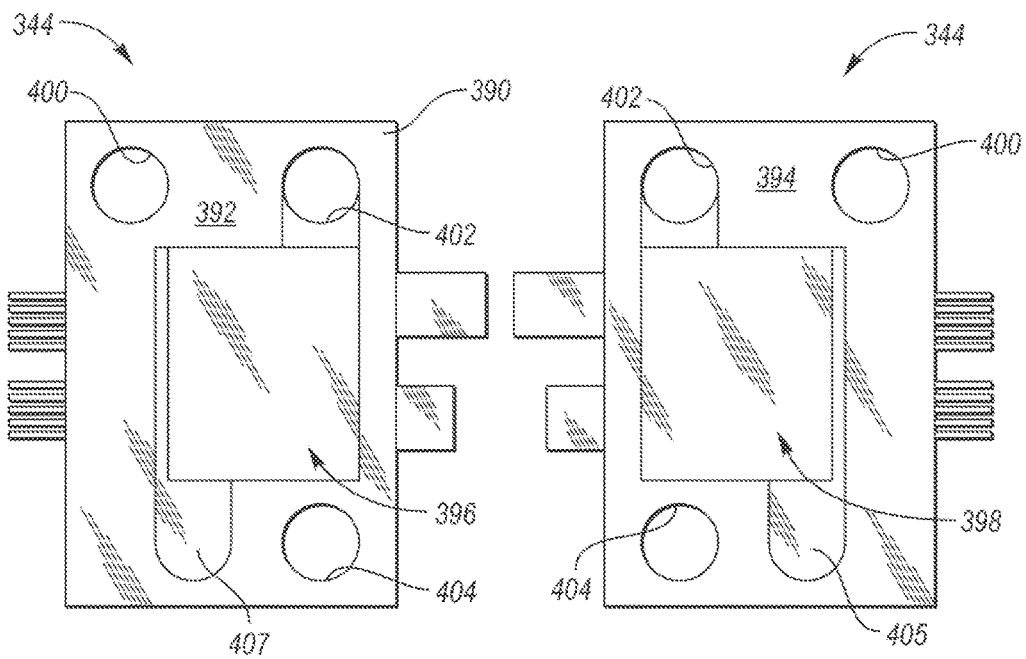
FIG. 14A is a front view of one of power modules of the first set of modules of the assembly of FIG. 12.
FIG. 14B is a back view of one of power modules of the first set.

Referring to FIGS. 14A and 14B, each of the A-modules 344 may include a body 390 having a front 392 and a back 394. The front 392 may define a coolant pocket 396 that includes a floor recessed from an outer surface of the front. The back 394 may define a coolant pocket 398 that includes a floor recessed from an outer surface of the back. The coolant pockets 396, 398 are configured to circulate coolant across the power stage disposed within the power module. The A-modules 344 may also define a plurality of bores extending between the front 392 and the back 394. For example, the A-modules 344 may include a first bore 400, second bore 402, and a third bore 404. The bores may also be referred to as passageways, holes, openings, or apertures.

For the A-modules 344 associated with the first series circuit 362, the bores 404 form a segment of the supply conduit 366, and the bores 400 form a segment of the return conduit 368. The bores 402 define the A-passageways 380. During operation, coolant enters the pocket 398 at area 405 and generally flows upwardly towards the top and through the bore 402 to the front pocket 396. The coolant then flows downwardly through pocket 396 from bore 402 to area 407. The fluid then flows through bore 418 of the adjacent B-module 346 to enter the next coolant chamber 372.

For the A-modules 344 associated with the second series circuit 364, the bores 400 form a segment of the dead conduit 370, and the bores 404 form a segment of the return conduit 368. The bores 402 define the A-passageway 384. During operation, coolant enters the pocket 396 at area 407 and generally flows upwardly towards the top and through the bore 402 to the back pocket 398. The coolant then flows downwardly through pocket 398 from bore 402 to area 405. The fluid then flows through bore 418 of the adjacent B-module 346 to enter the next coolant chamber 376. Thus, the flow direction through the front pocket 396 and the back pocket 398 in the first circuit 362 is generally opposite the flow directions through the pockets in the second circuit 364.

Figures 15A, 15B:
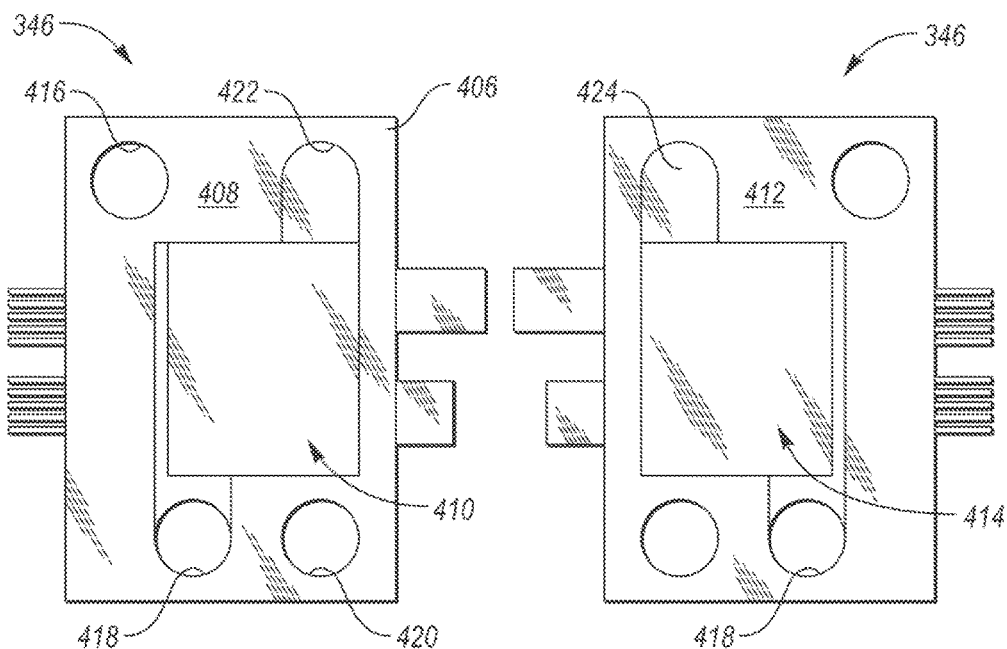
FIG. 15A is a front view of one of power modules of the second set of modules of the assembly of FIG. 12.
FIG. 15B is a back view of one of power modules of the second set.

Referring to FIGS. 15A and 15B, each of the B-modules 346 may include a body 406 having a front 408 and a back 412. The front 408 may define a coolant pocket 410 that includes a floor recessed from an outer surface of the front. The back 412 may define a coolant pocket 414 that includes a floor recessed from an outer surface of the back. The coolant pockets 410, 414 are configured to circulate coolant across the power stage disposed within the power module. The B-modules 346 also define a plurality of bores extending between the front 408 and the back 412. For example, the B-modules 346 may include a first bore 416, second bore 418, and a third bore 420.

For the B-modules 346 associated with the first series circuit 362, the bores 416 form a segment of the supply conduit 366, and the bores 420 form a segment of the return conduit 368. The bores 418 define the B-passageway 382. During operation, coolant enters the pocket 414 at area 424 and generally flows downwardly towards the bottom to bore 418 and through the bore to the front pocket 410. The coolant then flows upwardly through pocket 410 from bore 418 to area 422. The fluid then flows through bore 402 of the adjacent A-module 344 to enter the next coolant chamber 372.

For the B-modules 346 associated with the second series circuit 364, the bores 416 form a segment of the dead conduit 370, and the bores 420 form a segment of the return conduit 368. The bores 418 define the B-passageway 386. During operation, coolant enters the pocket 410 at area 422 and generally flows downwardly towards the bottom and through the bore 418 to the back pocket 414. The coolant then flows upwardly through pocket 414 from bore 418 to area 424. The fluid then flows through bore 402 of the adjacent A-module 344 to enter the next coolant chamber 376. Thus, the flow direction through the front pocket 408 and the back pocket 414 in the first circuit 362 is generally opposite the flow directions through the pockets in the second circuit 364.

Figure 16B:
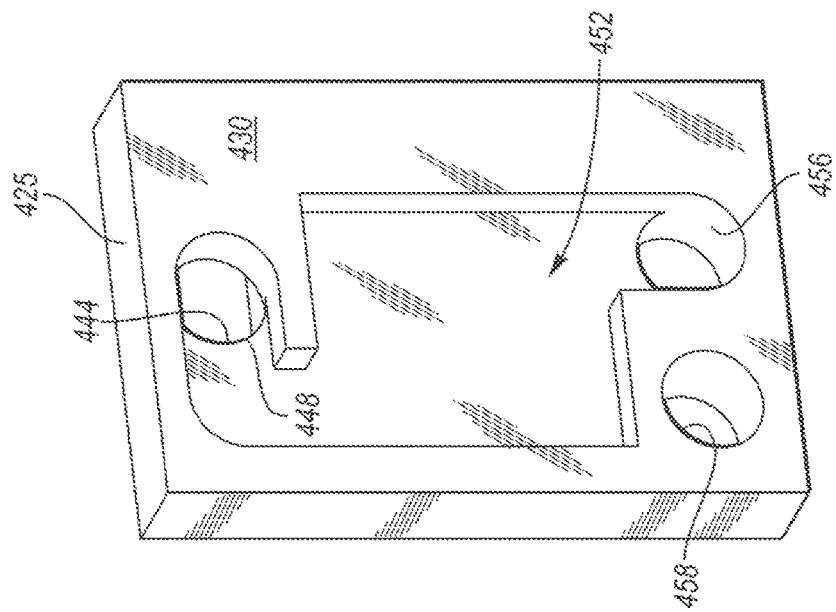
FIG. 16B is a back perspective view of the dummy module shown in FIG. 16A.
Figure 16A:
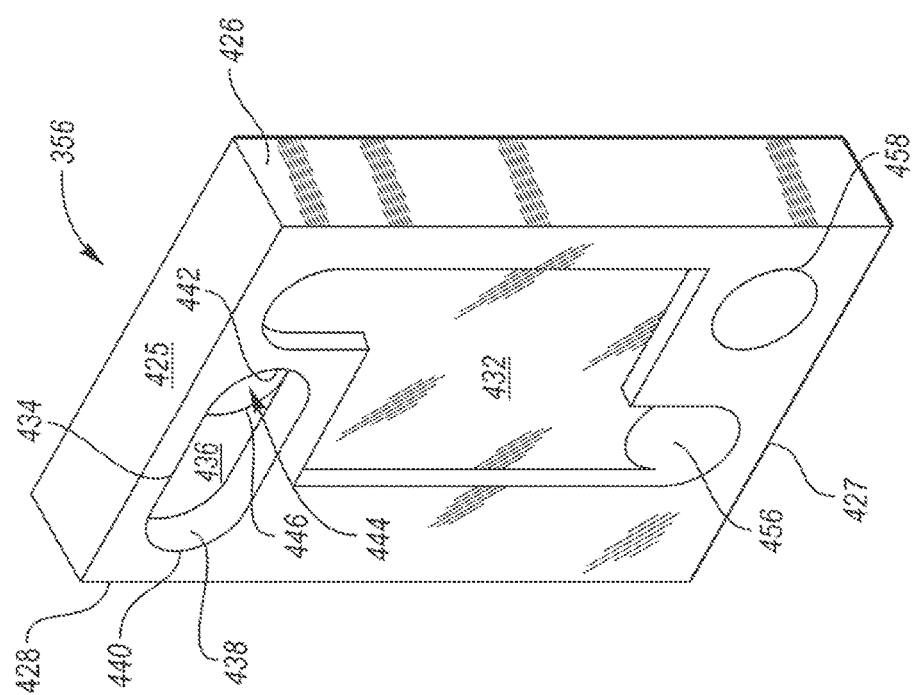
FIG. 16A is a front perspective view of a dummy module of the power-module assembly of FIG. 12.
Figure 18A:
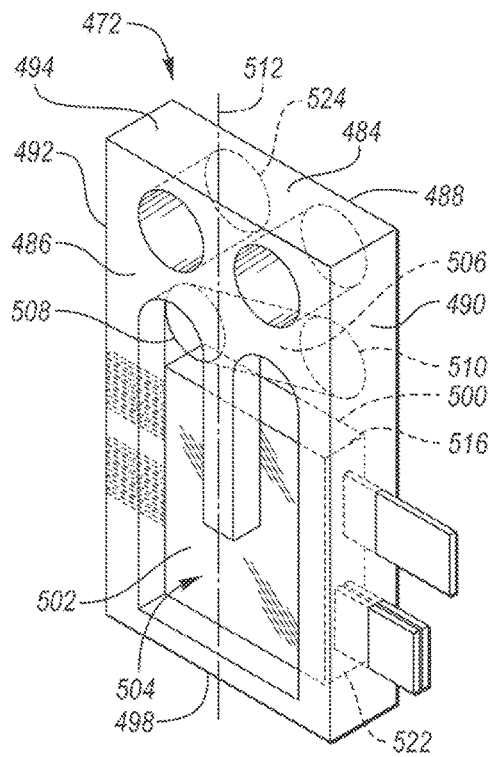
FIG. 18A is a perspective view of a power module of the assembly of FIG. 17.
Figure 19:
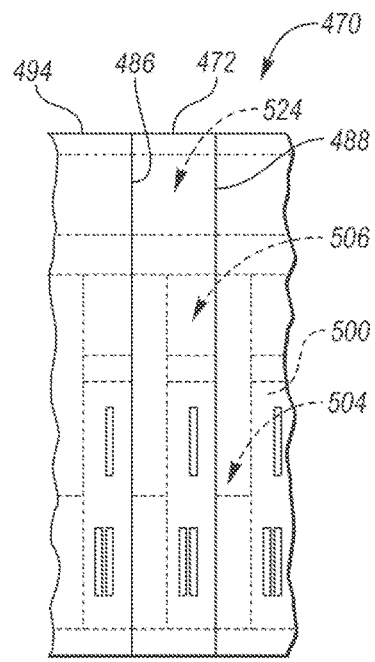
FIG. 19 is a side view of a portion of the assembly of FIG. 17.
Figure 18B:
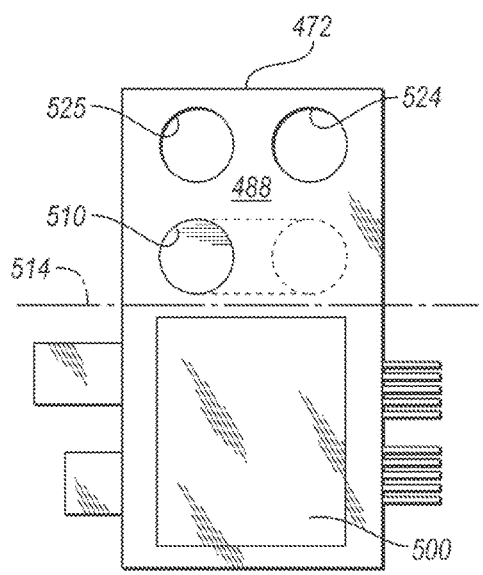
FIG. 18B is a back view of the power module of FIG. 18A.
Figure 18C:
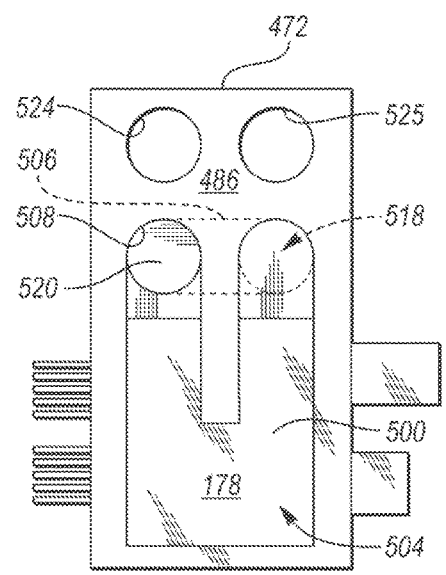
FIG. 18C is a front view of the power module of FIG. 18A.

Referring to FIGS. 16A and 16B, the dummy module 356 includes a body 426 having a top 425, a bottom 427, a front 428, and a back 430. The front 428 defines a pocket 432 that cooperates with the back pocket 398 of the adjacent A-module 344 to define one of the coolant chambers 372.

The front 428 also defines a channel 434 having a floor 436 and a sidewall 438 extending between the floor 436 and the front of the body 426. The channel 434 includes a left end 440 that is disposed against, and in alignment with, bore 400 of the adjacent A-module 344, and a right end 442. A bore 444 is defined in the body 426 at the right end 442 and extends between the floor 436 and the backside 430. The floor 436 defines the inlet 446 of the bore 444 and the back 430 defines the outlet 448 of the bore. During operation, coolant flows through the bore 402 (which is part of the supply conduit 336) and enters into the channel 434. The floor 436 redirects the coolant towards the vertical centerline of the dummy module to bore 444. (The floor 436 blocks coolant from flowing into bore 416 of the adjacent B-module 346, which creates the dead conduit 370.) Coolant then flows through a thickness of the dummy module 356 via bore 444 to the back pocket 452, which cooperates with the front pocket 410 of the adjacent B-module 346 to define one of the coolant chambers 376. From there, the coolant flows generally downwardly from bore 444 to another bore 456 that extends through a thickness of the body 426. On the front 428, bore 456 is in alignment with area 405 of the pocket 398; on the back 430, bore 456 is in alignment with bore 418 of the B-module 346. Some of the coolant flowing downwardly through the back pocket 452 is directed through bore 456 to the first series circuit 362, and some of the coolant is direct through bore 418 to continue through the second series circuit 364. The dummy module 356 also defines another bore 458 the forms a segment of the return conduit 368.

Referring to FIG. 17, an example power-module assembly 470 includes a plurality of power modules 472 arranged in a stack. The power-module assembly 470 includes a first power module 474 defining one end of the stack and a last power module 476 defining the other end of the stack. A first endplate 478 is disposed against the first module 474, and a second endplate 480 is disposed against the last module 476. The endplates cooperate to sandwich the stack and may provide compression to help hold the stack together. A dummy module 482 is disposed within the stack between two adjacent power modules and divides that stack into first and second portions. In this embodiment, all of the power modules 472 are the same.

Referring to FIGS. 18A-18C, and 19, each of the power modules 472 may include a body 484 having a front 486, a back 488, a right side 490, a left side 492, a top 494, and a bottom 498 that are interconnected along edges. The power stage 500 is at least partially disposed within the body. The body 484 may be a polymer or epoxy that encapsulates the power stage 500. Portions of the power stage 500 may be exposed through one or more sides of the body 484. For example, the terminals and the signal pins may extend through the left and right sides 490, 492, and the major sides 502 of the power stage may be exposed through the front and back 486, 488.

The power modules 472 may be arranged in the stack with the front 486 of one modules 472 disposed against the back of an adjacent module, and with the back 488 disposed against the front of another adjacent module. A gasket or other sealing means may be disposed between abutting modules to seal the stack.

A coolant circuit may be defined within the power-module assembly 470 to circulate coolant across the power stages 500 to cool the semiconductor devices. The endplates 478, 480, and the power modules 472 each includes ports, bores, pockets, and channels that interconnect in fluid communication to form the coolant circuit. The coolant circuit may a series-parallel circuit.

Each power module 472 may define a front coolant pocket 504 defined by the front 486. The pocket 504 includes a floor and a sidewall extending between the outer surface of the front 486 and the floor. The power stage 500 may be arranged in the body 484 such that a portion of the floor is formed by a plate of the power stage. This allows the coolant to circulator directly across the power stage 500 to increase cooling efficiency by removing thermal resistance between the coolant and the power stage 500.

A crossover passageway 506 is defined within the body 484 and extends between the front 486 and the back 488 to connect adjacent coolant pockets in fluid communication. The floor is considered to be part of the front even though it is recessed inwardly from the outer most surface of the front. The crossover passageway 506 includes a first port 508 and a second port 510 defined in the back 488. The passageway 506 may extend diagonally (i.e., the passageway extends through the body at an oblique angle relative to the front or back) through the body 484 such that the ports 508, 510 are axially offset relative to each other to place the ports on opposite sides of the longitudinal centerline 512 of the body 484. In other embodiments, the passageway 506 may extend diagonally such that the ports are on opposite sides of the latitudinal centerline 514 of the body 484.

Each of the ports is disposed next to an entrance end of the adjacent coolant channel. The backs 488 may be substantially flat or may include a pocket that matches that of the front pocket 504. When assembled, the back 488 cooperates with the front 486 of an adjacent power module to provide a ceiling for the pocket 504 to form a coolant chamber or channel. The power stage 500 may be positioned within the body 484 such that the second plate of the power module forms a portion of the outer surface of the back 486. In some embodiments, the second plate may be substantially flush with the outer surface of the back. Used herein, "substantially flush" is to be construed to mean two surfaces that are offset by less than or equal to 2 millimeters. This places the second plate directly in contact with the coolant circulating through the coolant channel 504.

The coolant channel 504 may be U-shaped with the first the second ends 518, 520 positioned above the top 516 of the power stage 500, and having a first segment extending from the first end across the power stage 132 to a turn portion located near the bottom 522 of the power stage 500, and a second segment extending from the turn portion to the second end 520. In other embodiments, the channel may be straight, Z-shaped, or W-shaped for example.

Each of the modules 122 may also define a bore 524 that extends between the front 486 and the back 488 at an angle that is substantially perpendicular to the front or the back. Each of the bores 524 is aligned with each other to create a conduit extending axially through the stack.

Figure 20A:
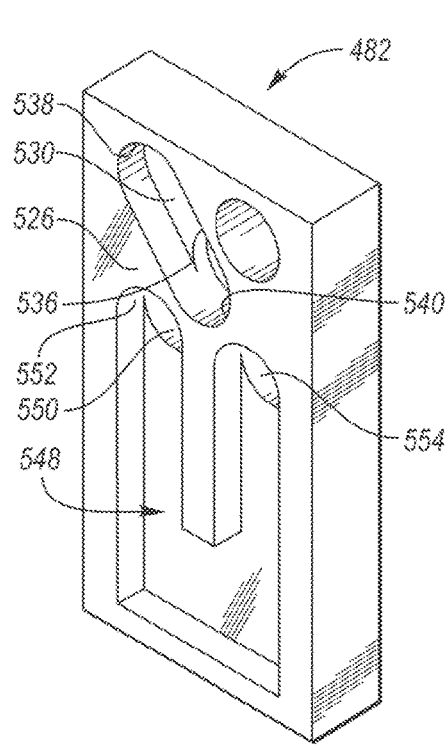
FIG. 20A is a front perspective view of a dummy module of the assembly of FIG. 17.
Figure 20B:
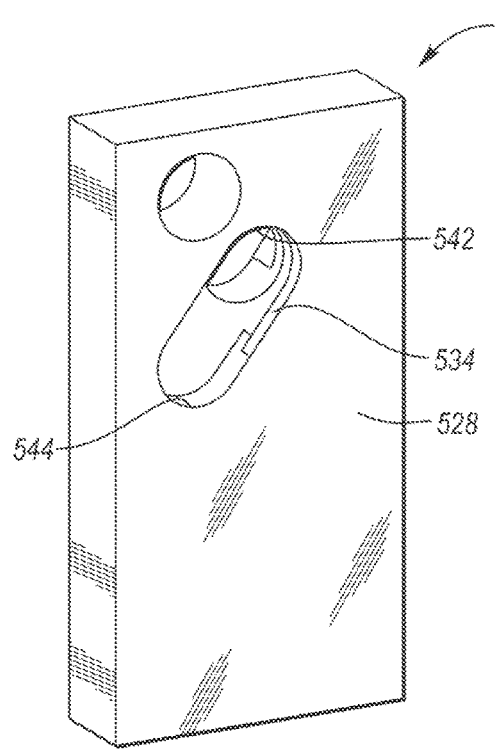
FIG. 20B is a back perspective view of the dummy module of the assembly of FIG. 17.
Figure 21:
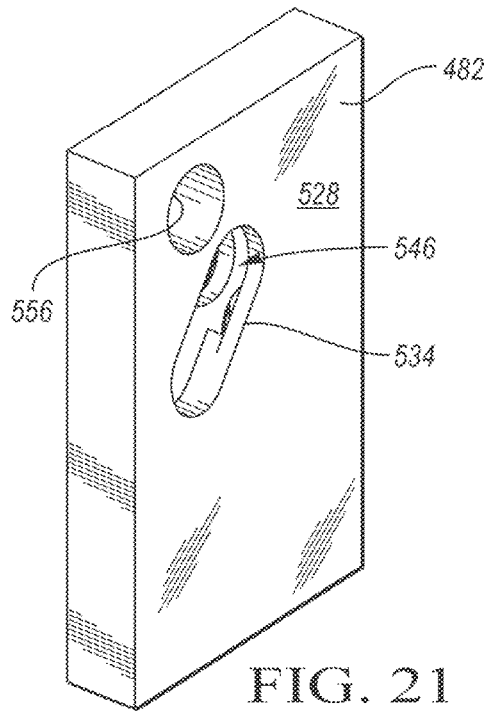
FIG. 21 is a detail view of a portion of the back of the dummy module of the assembly of FIG. 17.

Referring to FIGS. 20A, 20B and 21, the dummy module 482 includes a front side 526 and a back side 528. The front side 526 is disposed against a back side of one of the power modules 472, and the backside 528 is disposed against the front of another power module. The dummy module 482 alters the flow of the coolant circuit to split the coolant circuit into first and second loops. The power-module assembly 470 is arranged such that coolant first contacts the front side 526 of the dummy module. The dummy module 482 defines a first channel 530 having an inlet end 538, where the coolant enters the dummy module 482, and an outlet end 540 defining an outlet port 536 that extends towards the back 528. A second channel 534 is defined in the back 528 and includes an inlet end 542 that receives coolant through the port 536, and an outlet end 544 that aligns with an inlet end of an adjacent coolant channel. Some of the coolant entering into the dummy module flows to the adjacent power module via channel 534. A U-shaped pocket 548 is defined in the front 526. In some embodiments, the pocket may be shaped differently. The U-shaped pocket 548 includes a port 550 located at an inlet end 552 of the pocket 548, and an outlet end 554 that is aligned with the inlet port 510 of an adjacent power module 472. The U-shaped pocket 548 is connected in fluid communication with the channel 434 via a passageway 546. The passageway 546 conveys a portion of the coolant from the back 528 to the pocket 548 on the front 526. The dummy module 482 also defines a bore 556 extending between the front 526 and the back 528.

Figure 22:
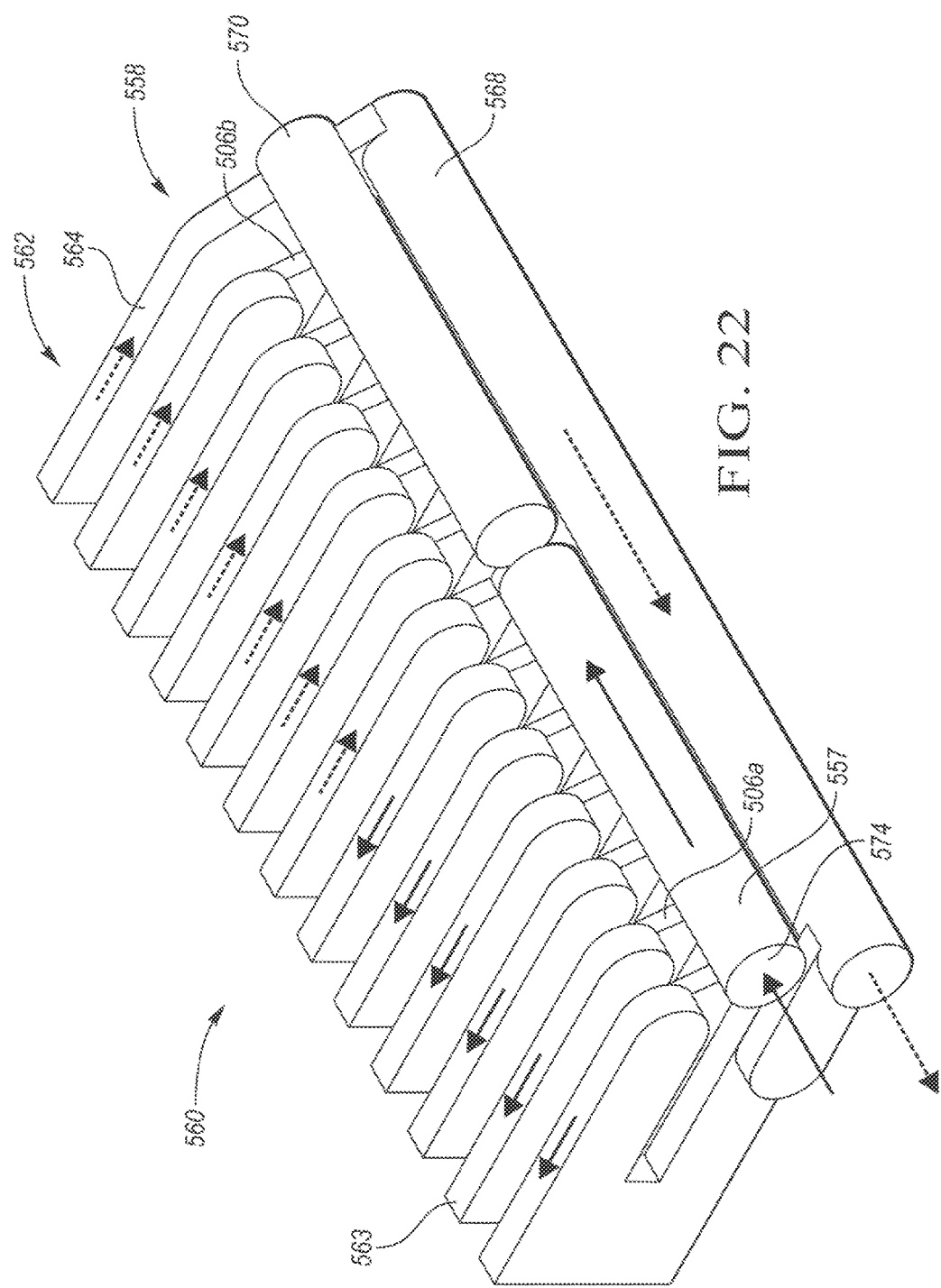
FIG. 22 is a schematic representation of a series-parallel cooling circuit for the power-module assembly shown in FIG. 17.

Referring to FIG. 22, a series-parallel cooling circuit 558 for the power-module assembly 470 is shown. The coolant circuit 558 includes a first series circuit 560 disposed on one side of the dummy module 482, and a second series circuit 562 disposed on the other side of the dummy module. The first circuit 560 includes a plurality of coolant chambers 563 that are formed by the cooperation of the pockets 548 and the front or back of the power modules 472. The second circuit 562 also includes a plurality of cooling chambers 564. The chambers 563 of the first circuit 560 may flow in a generally downward direction, and the chambers 564 may flow in a generally downward direction when the power module assembly 470 is in the orientation shown in FIG. 17. The cooling circuit 558 includes a supply conduit 557 that is formed by the cooperation of the bores 524 of the power modules in the first portion of the assembly 470. The supply conduit 557 extends from the inlet port 574 to the channel 530 of the dummy module. A floor of the channel 530 prevents the coolant circulating to the bores 524 of the power modules in the second portion. Thus, the bores 524 of the second portion cooperate to define a dead conduit 570 that does not circulate coolant. Once the coolant reaches channel 530, a portion of the coolant circulates into the coolant chambers 564 of the second circuit 562, and a portion of the coolant circulates into the cooling chambers 563 of the first circuit 560. The crossover passages 506*a* convey coolant between the chambers 563, and the crossover passages 506*b* convey coolant between the chambers 564. The second circuit 562 includes a return conduit 568 that is formed by the cooperation of the bores 525 defined in each of the power modules 472 and bore 556 of the dummy module. Flow through the first series circuit 560 is towards the outlet port 572; thus a return conduit is not required.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power inverter comprising: power modules each including a power stage and a major side defining a coolant pocket recessed toward the power stage, the power modules being stacked in an array with the coolant pockets interleaved with the power stages; and a dummy module disposed between two adjacent power modules to divide the array into first and second portions and defining a recessed second coolant pocket cooperating with one of the coolant pockets to define a coolant chamber.

2. The power inverter of claim 1 wherein the major side of one of the power modules is in direct contact with the major side of an adjacent one of the power modules.

3. The power inverter of claim 1 wherein the power modules are stacked such that pockets adjacent to each other cooperate to define coolant chambers interleaved with the power modules.

4. The power inverter of claim 3 wherein each of the power modules defines a coolant passageway extending therethrough and connecting an adjacent pair of the coolant chambers in fluid communication, wherein a first end of the coolant passageway opens into one of the adjacent pair of coolant chambers and a second end of the coolant passageway opens into the other of the adjacent pair of coolant chambers.

5. The power inverter of claim 1 further comprising a pair of first and second endplates sandwiching the array, wherein the first portion is defined between the first end plate and the dummy module, and the second portion is defined between the second endplate and the dummy module, and wherein coolant flow through the coolant chambers of the first portion is in a first direction and coolant flow through the coolant chambers of the second portion is in a second direction that is different than the first direction.

6. The power inverter of claim 1 wherein each of the power modules defines at least two coolant passageways, wherein the dummy module defines at least one coolant passageway, and wherein each of the power modules includes more coolant passageways than the dummy module.

7. The power inverter of claim 1 further comprising:
a capacitor bank electrically connected to each of the power stages; and
a gate drive board electrically connected to each of the power stages.

8. A power-electronics system comprising: a plurality of power modules each including a power stage and defining a recessed side pocket, the power modules being stacked in an array such that the side pockets are interleaved with the power stages; and a dummy module defining a recessed first coolant pocket and disposed within the array such that the first coolant pocket cooperates with one of the side pockets to define a coolant chamber.

9. The power-electronics system of claim 8 wherein each of the power modules has an outer surface and the side pocket is recessed into the outer surface and includes a floor and a sidewall extending between the floor and the outer surface, the floor defining an inlet port and an outlet port, and wherein the first coolant pocket is recessed into an outer surface of the dummy module and includes a floor and a sidewall extending between the floor and the outer side, the floor of the dummy module defining a single port.

10. The power-electronics system of claim 8 wherein the dummy module further defines a recessed second coolant pocket on a side opposite the first coolant pocket, and wherein the dummy module is further disposed within the array such that the second coolant pocket cooperates with another of the side pockets to define another coolant chamber.

11. The power-electronics system of claim 10 wherein the dummy module further defines a single passageway that fluidly connects the coolant chambers.

12. The power-electronics system of claim 8 wherein the dummy module divides the array into first and second longitudinal portions, and wherein the array is configured such that coolant flows through the side pockets of the first portion in a first direction and coolant flows through the side pockets of the second portion in a second direction.

13. The power-electronics system of claim 8 wherein each of the power modules defines at least first and second coolant bores extending therethrough, and each of the first and second coolant bores is seated against, and cooperates with, at least one of the other first and second coolant bores, respectively, to define at least a segment of a first and second conduit, respectively, that extends longitudinally through the array and is in fluid communication with at least two of the coolant chambers, wherein the dummy module defines a third coolant bore aligned with an adjacent one of the first coolant bores to form another segment of the first conduit, and the dummy module defines a blocking surface aligned with an adjacent one of the second coolant bores to define an end of the second conduit.

14. The power-electronics system of claim 8 wherein the power modules cooperate to define first and second conduits extending longitudinally through the array, wherein the dummy module defines a coolant bore forming a segment of the first conduit and a blocking surface that defines an end of the second conduit.

15. A power-module assembly for a power-electronics system comprising:
a plurality of same power modules each including a power stage and major sides each defining a recessed pocket adjacent to the power stage, wherein the power modules are stacked in an array such that pockets adjacent to each other form coolant chambers interleaved with the modules; and
a dummy module having a same footprint as the power modules and disposed within the array between two adjacent power modules to divide the array into first and second portions, wherein the array is configured such that coolant flows through the coolant chambers of the first portion in a first direction and coolant flows through the coolant chambers of the second portion in a second direction.

16. The power-module assembly of claim 15 wherein the first direction is generally from a bottom portion of the power modules towards a top portion of the power modules, and wherein the second direction is generally from the top portion towards the bottom portion.

17. The power-module assembly of claim 15 wherein the dummy module includes a front defining a second recessed pocket and a back defining a third recessed pocket, wherein the dummy module is further disposed within the array such that the second pocket cooperates with one of the pockets of the power modules to define a second coolant chamber, and the third pocket cooperates with one of the pockets of the power modules to define a third coolant chamber, and wherein the dummy module defines a passageway that fluidly connects the second and third coolant chambers.

18. The power-module assembly of claim 15 wherein each of the power stages defines major sides, and wherein each of the pockets includes a floor recessed into a corresponding one of the power modules such that one of the major sides of each of the power stages forms a portion of the floor allowing coolant to be circulated directly across a corresponding one of the power stages.

19. The power-module assembly of claim 15 wherein each of the power modules defines at least two coolant passageways, wherein the dummy module defines at least one coolant passageway, and wherein each of the power modules includes more coolant passageways than the dummy module.

20. The power-module assembly of claim 15 wherein the first portion includes more power modules than the second portion.

* * * * *